United States Patent [19]
Beck et al.

[11] Patent Number: 5,784,330
[45] Date of Patent: Jul. 21, 1998

[54] EVENLY DISTRIBUTED RC DELAY WORD LINE DECODING AND MAPPING

[75] Inventors: John Andrew Beck, Austin; Terry Lee Leasure, Georgetown; Gus Wai-Yan Yeung, Austin, all of Tex.

[73] Assignee: International Business Machines Corporation, Armonk, N.Y.

[21] Appl. No.: 752,981

[22] Filed: Dec. 2, 1996

[51] Int. Cl.$^6$ .................................. G11C 8/00
[52] U.S. Cl. .................... 365/230.06; 365/230.01
[58] Field of Search .................... 365/230.06, 194, 365/206, 230.01, 51, 63; 711/202

[56] References Cited

U.S. PATENT DOCUMENTS

| | | | |
|---|---|---|---|
| 4,985,865 | 1/1991 | Houston | 365/194 |
| 5,128,897 | 7/1992 | McClure | 365/230.06 |
| 5,323,360 | 6/1994 | Pelley, III | 365/233.5 |
| 5,381,377 | 1/1995 | Bewick et al. | 365/230.06 |
| 5,414,663 | 5/1995 | Komarek et al. | 365/210 |
| 5,546,350 | 8/1996 | Gillingham | 365/230.06 |
| 5,577,003 | 11/1996 | Fuji | 365/230.01 |

*Primary Examiner*—David C. Nelms
*Assistant Examiner*—Son Mai
*Attorney, Agent, or Firm*—Anthony V. S. England; Jack V. Musgrove; Andrew J. Dillon

[57] ABSTRACT

A device for accessing a specific word line in a memory array has improved noise protection by smoothing out the RC load in the word line mapping circuit. The word lines are respectively connected to rows of memory cells in the memory array, and predecoded word lines are used to decode encoded addresses which correspond to the various rows. The circuit connects the word lines to the predecoded word lines by gates which are tapped into the predecoded word lines, and the taps on a given predecoded word line are non-adjacent, to more evenly distribute the RC delay for each predecoded word line. In other words, the word lines are interspersed, out of order. The word lines can be interspersed randomly, or according to a predetermined function, such as a modulo function. The RC load for a given predecoded word line is preferably uniformly distributed along substantially the entire length of the predecoded word line.

20 Claims, 5 Drawing Sheets

EVENLY DISTRIBUTED RC DELAY WORD LINE DECODING AND MAPPING

BACKGROUND OF THE INVENTION

1. Field of the Invention

The present invention generally relates to accessing memory arrays in computer systems, and more particularly to a device for decoding a word line such that the load is evenly distributed to equalize performance and enhance noise protection.

2. Description of the Prior Art

Conventional computers use several pieces of interconnected hardware, including input/output devices for the user interface (such as a keyboard and display), a permanent storage device (such as a magnetic or optical disk), a temporary memory device (such as random access memory or RAM), and a central processing unit (CPU or processor) which accesses the permanent storage and temporary memory when carrying out program instructions. The present invention relates to a device for accessing temporary memory devices such as RAM (static or dynamic) but is also applicable to other forms of memory arrays, such as read-only memory (ROM, either mask-programmed type or electrically programmable), etc., and to other circuit functions which use similar addressing techniques.

These arrays are often organized in rows and columns, and sometimes further by other groupings such as sectors, wherein a sector may include many columns. A given memory cell (bit) in the array is accessed for a store or load operation by selecting the particular cell based on its address. Such selection is commonly performed by a row decoding circuit which presents an active logic level on a conductor, known as a "word line," which traverses a given row of cells. When the word line for given row is activated, all of the memory cells in the row are connected to their respective "bit lines," which are in turn connected to other circuitry, such as a sense amplifiers, that allow the memory cells to be accessed. For example, a word line can access an array having 32 cells in a row to provide a 32-bit value (program instruction or data). In a memory array having $2^N$ word lines, an address input of N bits is generally required to select one of the word lines. Each word line has a mapping circuit, and all of the mapping circuits receive and decipher the N-bit address input. In response thereto, only one word line is selected, and all other word lines in the array are deselected. For additional information on word lines see, e.g., U.S. Pat. Nos. 4,985,865, 5,128,897 and 5,381,377.

FIG. 1 illustrates an example of a 256-row ($2^8$) memory array wherein the rows are accessed by means of two groups 2, 4 of 16-bit "predecoded" lines, 2a through 2p and 4a through 4p. Any encoding method may be used to predecode a unique 8-bit memory address into the two 16-bit groups. A given word line 6 is selected by simply combining the appropriate line of the first group 2 with another line in the second group 4, in an AND operation. Only 19 of the 256 word lines (w0 through w18) are shown in FIG. 1. Since only one line in each 16-bit group 2, 4 is turned on (a high state, or "1"), only one word line will be selected and all others will be deselected. For example, the first word line (w0) is selected if the lowest bit 2a of group 2 and the lowest bit 4a of group 4 are turned on (i.e., the sequential order of 2a through 2p being "1000000000000000" and the sequential order of 4a through 4p likewise being "1000000000000000").

In order to generate these word lines, each of the 16 predecoded lines in group 2 must be repeatedly tapped before the next line is tapped, i.e., there are 16 adjacent connections along a given one of the lines in group 2, one for each line in group 4. This sequence causes uneven distribution of the RC delay across the 256 word lines. Each line is physically a wire trace, and has an apparent resistance and capacitance. The RC delay is the result of this effective resistor-capacitor circuit. In FIG. 1, the low addresses have all of the load at the near end of the driver, while the higher addresses have all their load at the far end of the driver. For example, for the first line 2a in group 2 (line 0), the RC is effectively seen, or lumped, very near the input end of the circuit, that is, at the bottom of the figure. Thus, even though this decoding technique can achieve fast performance, it polarizes fast and slow paths, and this makes the circuit more vulnerable to noise. This skewing effect is exacerbated as the array becomes larger. It would, therefore, be desirable to devise a method of decoding word lines which retains high speed performance but avoids the uneven distribution of the load, so as to impart improved noise protection. It would be further advantageous if the mapping circuit allowed simplified access to the array for, e.g., testing.

SUMMARY OF THE INVENTION

It is therefore one object of the present invention to provide an improved word line mapping circuit for selectively accessing memory cells in a computer system.

It is another object of the present invention to provide such a word line mapping circuit which provides fast performance without requiring more complex logic (increased semiconductor area).

It is yet another object of the present invention to provide such a word line mapping circuit having improved noise protection, and which can easily accommodate mapping of the cells to simplify testing.

The foregoing objects are achieved in a word line mapping circuit generally comprising a plurality of word lines respectively connected to rows of the memory array, means for encoding an address associated with a given row, means for predecoding the address into a plurality of predecoded word lines, and means for presenting an active logic level to a given one of the word lines based on the predecoded word lines, the presenting means being connected to the predecoding means such that an RC load associated with a given one of the predecoded word lines is distributed along the given predecoded word line. The word lines are interspersed, out of order, so as to provide more even loading of the RC delays, that is, the word lines are generated by gates which are tapped into the predecoded word lines, and the taps on a given predecoded word line are non-adjacent. The word lines can be interspersed randomly, or according to a predetermined function, such as a modulo function. The RC load for a given predecoded word line is preferably uniformly distributed along substantially the entire length of the predecoded word line.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DESCRIPTION OF THE PREFERRED EMBODIMENT

Figure 2:
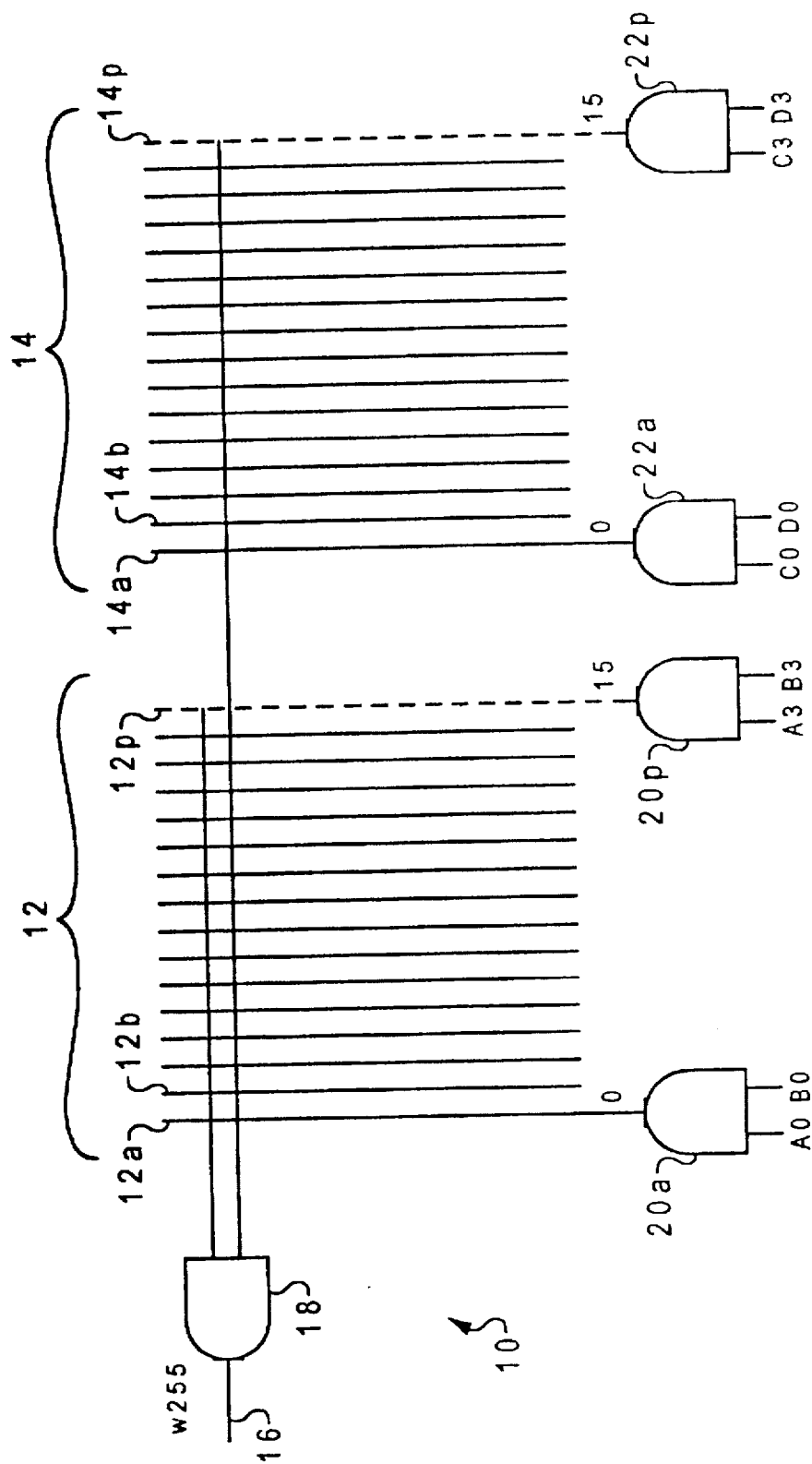
FIG. 2 is a schematic representation of one embodiment of a word line mapping circuit according to the present invention.

With reference now to the figures, and in particular with reference to FIG. 2, there is depicted one embodiment 10 of a word line mapping circuit of the present invention. Mapping circuit 10 is used to address a 256-row memory array, and generally comprises two 16-conductor groups 12 and 14 which are used to generate different word lines by means of a plurality of AND gates. For simplicity, only one word line 16 (w255) and its corresponding AND gate 18 are shown. Each word line is a conductor that presents an active logic level to a given row of memory cells, allowing that row to be connected to other circuitry, such as a sense amplifiers, that detect the contents of the memory cells. Each of the "predecoded" word lines 12a through 12p in group 12 are the outputs of respective AND gates 20a through 20p, and each of the predecoded word lines 14a through 14p in group 14 are the outputs of respective AND gates 22a through 22p. The inputs to the first set of gates 20a through 20p are divided into two groups of four each (A0, A1, A2, and A3; and B0, B1, B2 and B3). The inputs to the second set of gates 22a through 22p are also divided into two groups of four each (C0, C1, C2, and C3; and D0, D1, D2 and D3).

Figure 1:
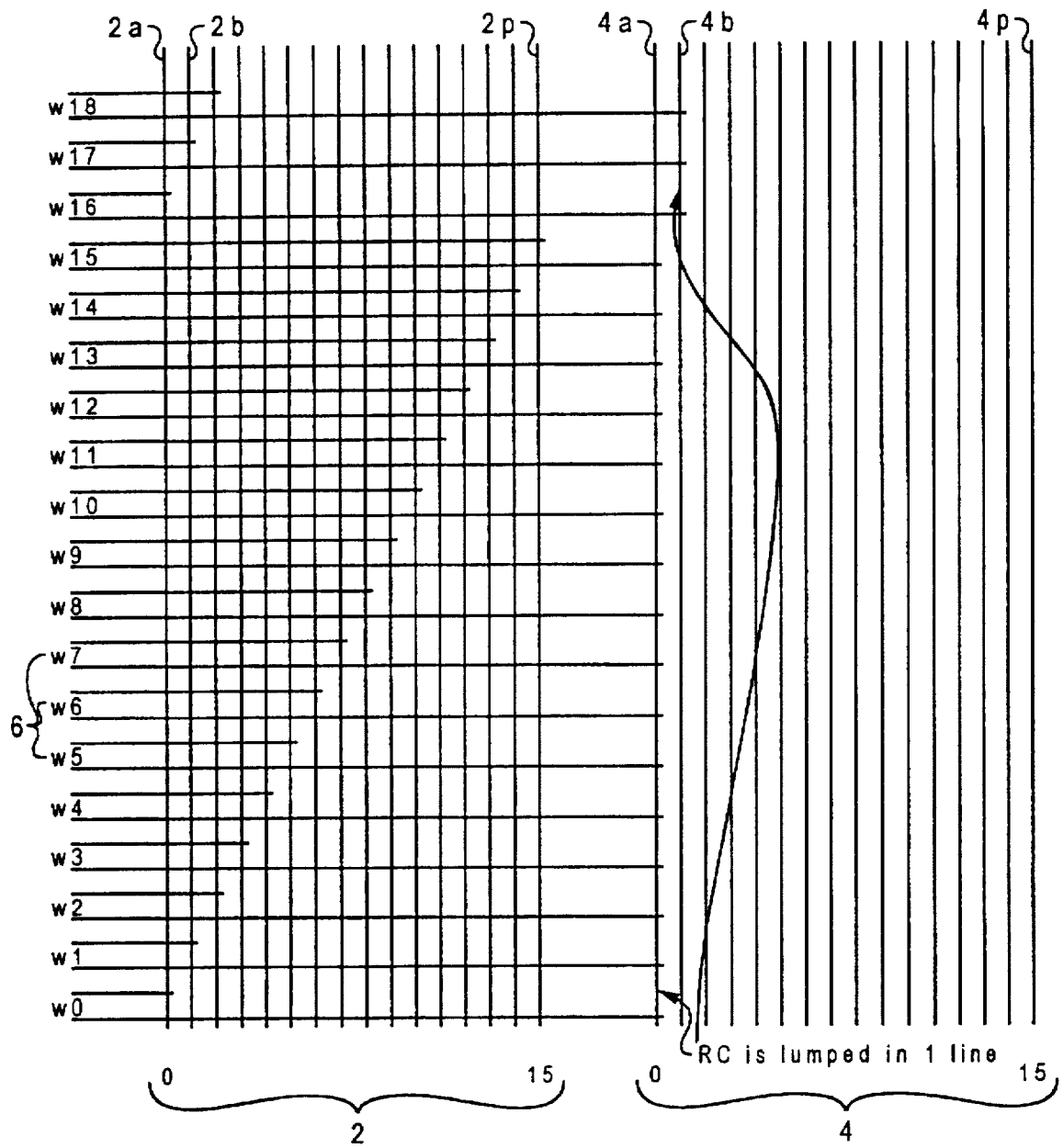
FIG. 1 is a schematic representation of a prior art word line mapping circuit.
Figure 3:
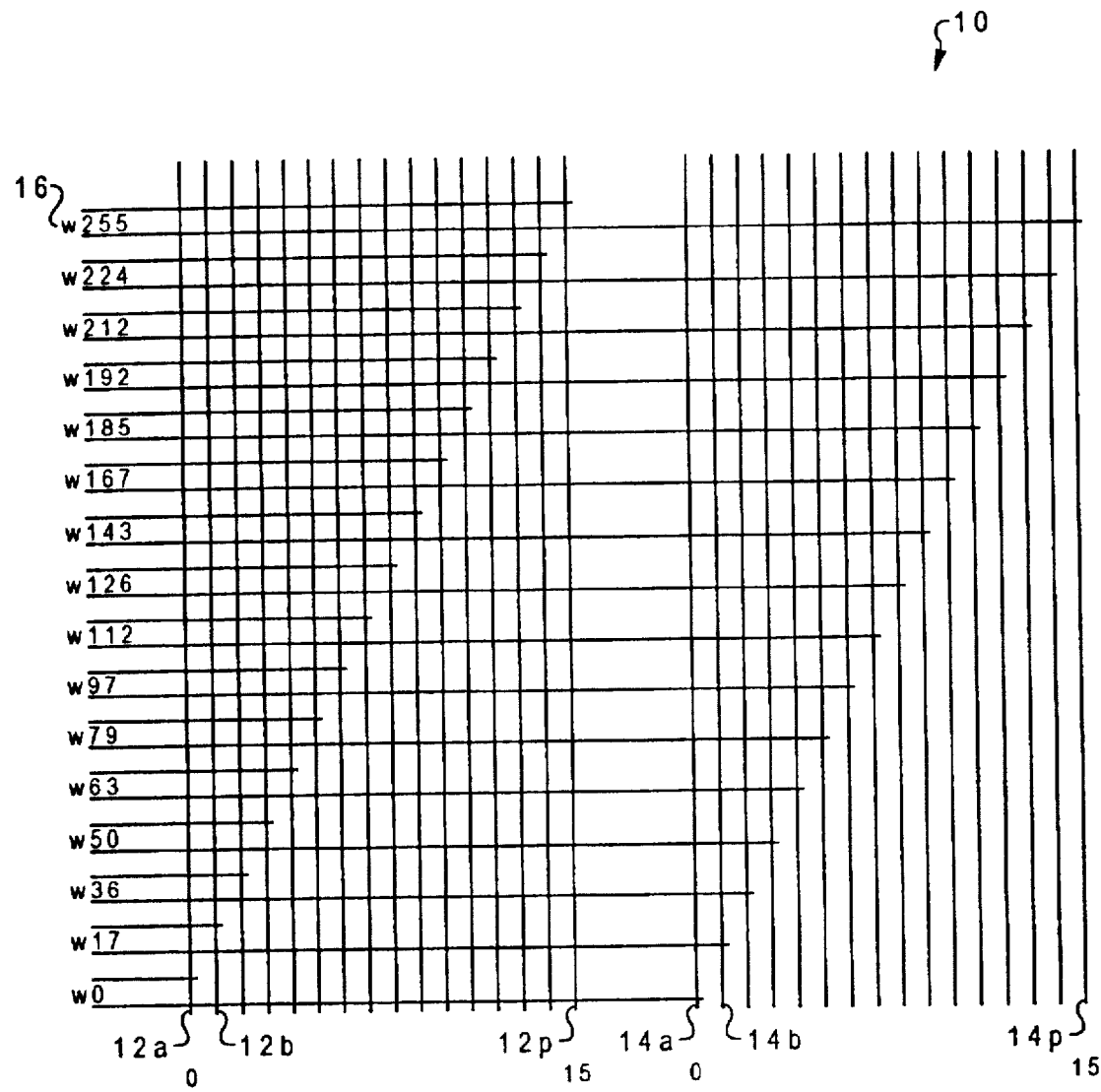
FIG. 3 is a more detailed representation of a portion of the word line mapping circuit of FIG. 2.

In comparing mapping circuit 10 of FIG. 2 with the prior art circuit of FIG. 1, note in particular that the prior art circuit does not include the preferred encoding scheme (discussed below) that determines the input values of A0, A1, etc. Also, mapping circuit 10 has a different word line order, as shown in FIG. 3. Specifically, the word lines are randomly interspersed, out of order, so as to provide more even loading of the RC delays. In other words, the taps on a given line are non-adjacent. FIG. 3 shows only a portion (1/16th) of the word lines, but this is sufficient to convey how a given line in group 12 is tapped by interconnecting it with the other lines in group 14 at wider intervals than that shown in FIG. 1. By distributing the interconnections along a larger length of each line, the RC delay is spread out more. The distribution does not need to be perfectly uniform (i.e., all 16 taps on a given line spread out exactly, along substantially the entire length of the line), but this is preferable since optimum distribution of the RC load minimizes noise effects.

The special encoding scheme used to convert the 8-bit memory cell address into the 32 lines 12a through 12p and 14a through 14p is based on the following truth table:

TABLE 1

| Encoding truth table | | |
|---|---|---|
| first bit | second bit | 4 bit result |
| 0 | 0 | 0001 |

TABLE 1-continued

| Encoding truth table | | |
|---|---|---|
| first bit | second bit | 4 bit result |
| 0 | 1 | 0010 |
| 1 | 0 | 0100 |
| 1 | 1 | 1000 |

This is a "1 of 4" encoding scheme which makes it very easy to decode a large word line field with very few stages. To use this scheme to decode 256 word lines (an 8 bit address), the 8 bits are paired to provide inputs to the truth table. Each pair results in a 4 bit output. The four bits from the lowest pair become A0, A1, A2 and A3, the four bits from the next pair become B0, B1, B2 and B3, and so on. The first two groups (A, B) are used to generate the first group of 16 lines 12a through 12p, and the second two groups (C, D) are used to generate the second group of 16 lines 14a through 14p. With this decoding scheme, the circuit can achieve fast performance, it is easy to implement using gates 20a through 20p and gates 22a through 22p. A conventional binary 4 to 16 line decoding scheme cain be used to produce the same results.

Figure 4:
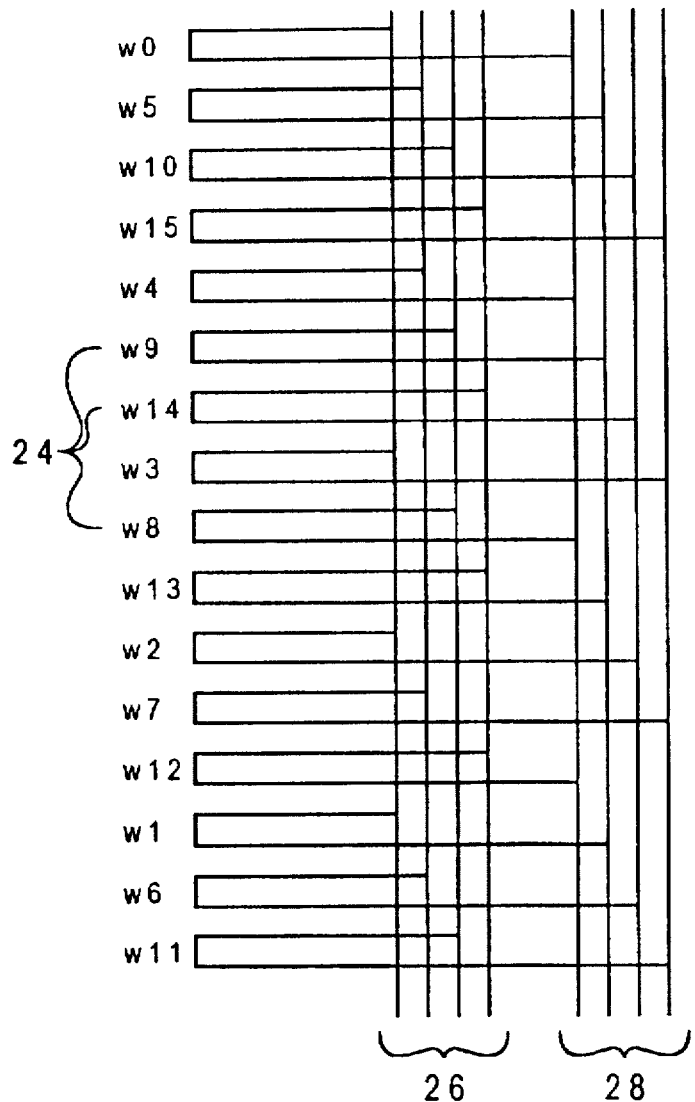
FIG. 4 is a schematic representation of one example of word line mapping as taught by the present invention.

While "random" word line decoding as illustrated in FIG. 3 can achieve high decoding speed and good noise protection by minimizing the skewing of the RC delay, the resulting word organization is not conducive to all forms of access. For example, in testing the memory cells, it is necessary to build a mapping relation between adjacent physical word lines and their addresses. If the word line is not organized in a simple manner, it will require a set of register files or complex logic to generate the physical mapping function for testing the correctness of each word line. The present invention can be further simplified for testing by providing a deterministic mapping function which still allows for even distribution of RC delay but requires no complex logic. FIG. 4 illustrates such an evenly distributed RC (ERC) word line mapping which employs a modulo function to determine which word lines are adjacent, i.e., which word line values are mapped to which physical locations. In the example of FIG. 4, there are only 16 word lines 24, generated from two groups 26, 28 of 4 lines each. The word line order is: w0, w5, w10, w15, w4, w9, w14, w3, w8, w13, w2, w7, w12, w1, w6, w11. Table 2 further illustrates the word line mapping and resulting encoded ERC order:

TABLE 2

| ERC Word Line Mapping | | | |
|---|---|---|---|
| Physical location | Mapped location | Encoded sequential order | Encoded ERC order |
| 0 | 0 | 0001 0001 | 0001 0001 |
| 1 | 5 | 0001 0010 | 0010 0010 |
| 2 | 10 | 0001 0100 | 0100 0100 |
| 3 | 15 | 0001 1000 | 1000 1000 |
| 4 | 4 | 0010 0001 | 0010 0001 |
| 5 | 9 | 0010 0010 | 0100 0010 |
| 6 | 14 | 0010 0100 | 1000 0100 |
| 7 | 3 | 0010 1000 | 0001 1000 |
| 8 | 8 | 0100 0001 | 0100 0001 |
| 9 | 13 | 0100 0010 | 1000 0010 |
| 10 | 2 | 0100 0100 | 0001 0100 |
| 11 | 7 | 0100 1000 | 0010 1000 |
| 12 | 12 | 1000 0001 | 1000 0001 |
| 13 | 1 | 1000 0010 | 0001 0010 |

TABLE 2-continued

ERC Word Line Mapping

| Physical location | Mapped location | Encoded sequential order | Encoded ERC order |
|---|---|---|---|
| 14 | 6 | 1000 0100 | 0010 0100 |
| 15 | 11 | 1000 1000 | 0100 1000 |

The mapping function can be expressed as:

$$x''=modulo16(x'+5),$$

where x' is the current word line address (beginning with zero), and x" is the next word line address. It is particularly easy to test the memory sequentially by word line number when using a modulo mapping function combined with the encoding scheme based on Table 1. As can be seen in Table 2, the second group of four bits under "Encoded sequential order" is the same as the second group of four bits under "Encoded ERC order." Therefore, it is only necessary to modify the first group of four bits to achieve the mapping. This modification is further simplified by the fact that the first group of four bits under "Encoded ERC order" can be generated by shifting the first group of four bits under "Encoded sequential order" by the position indicated in the second group of four bits under "Encoded sequential order." This means the entire mapping network can be constructed with 3 shift registers and a few logic gates.

The modulo mapping function can be expanded to a 256 word line memory array with the following equation:

$$x''=modulo256(x'+17).$$

These examples can further be extended to any non-prime number of word lines. For any array type or decoding, a two-stage system can be used. The first stage generates the above mentioned predecoded word lines, which have been illustrated as being in two groups (although there could be more). One line from each group is then used to drive the second (and final) "select" line. For optimal loading characteristics, the predecoded word lines should be tapped (assigned) according to the two following generalized functions, depending upon whether the number of word lines in the group with the most word lines is even or odd. If this number ("maxlines") is even, then the predecoded word lines are assigned using the following equation:

$$x''=modulo(M)[x'+maxlines+1],$$

where M is the modulus base which is equal to the product of the numbers of word lines in each group. If maxlines is odd, then the predecoded word lines are assigned using the following equation:

$$x''=modulo(M)[maxpower+x'+maxlines]$$

where $$maxpower=maxlines^{(n-1)},$$

and n=current iteration number through the maxlines predecode group (n varies from 1 to "minlines", which is the number of lines in the group that is not the maxlines group).

Figure 5:
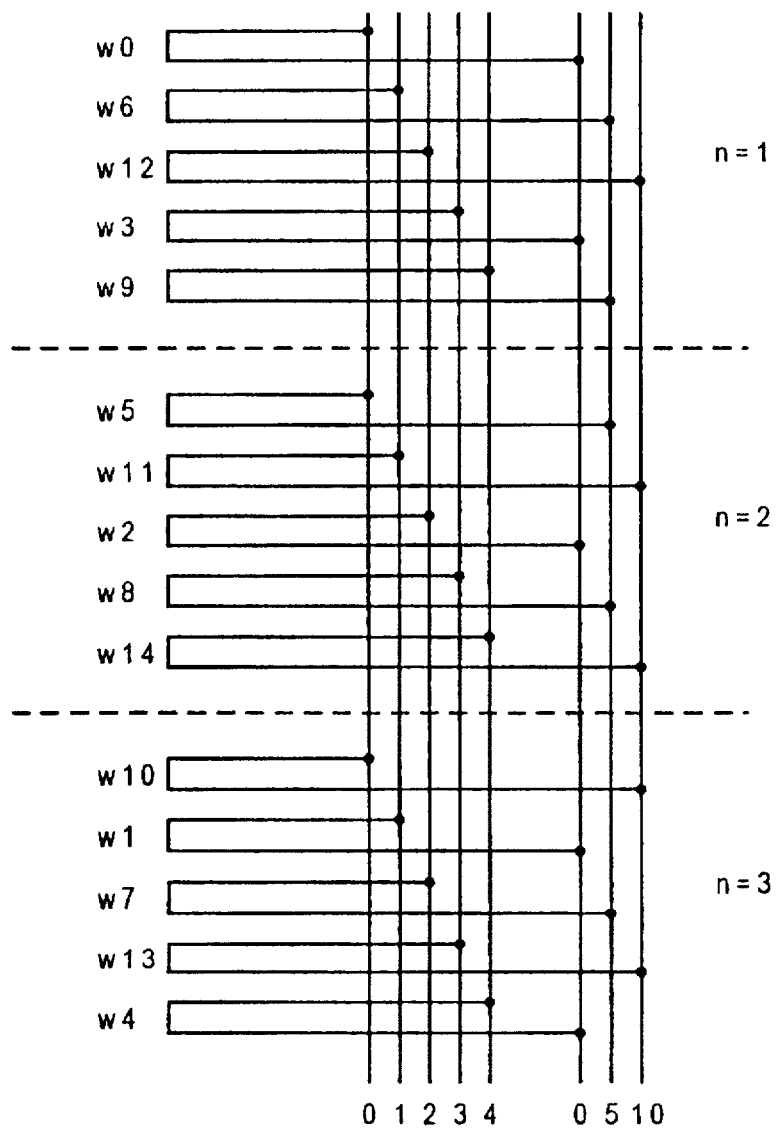
FIG. 5 is a schematic representation of another example of word line mapping as taught by the present invention.

An illustration of a mapping circuit using two groups of 3 lines and 5 lines (to access 15 rows), and implemented in accordance with the foregoing equation, is shown in FIG. 5. The word line order is: w0, w6, w12, w3, w9, w5, w11, w2, w8, w14, w10, w1, w7, w13, w4.

As noted above, this approach can be generalized to more than 2 predecode groups, and more than two stages. The present invention is also applicable to other circuit functions besides RAM, which use similar addressing techniques or having array-like structures or registers.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A device for electronically selecting one of a plurality of locations in an array, comprising:

a first group of conductors;

a second group of conductors;

a plurality of gates each having a first input connected to one of said first group of conductors, a second input connected to one of said second group of conductors, an output connected to one of the locations in the array, and means for presenting an active logic level to said output based on said first and second inputs such that a location having said active logic level is selected; and means for connecting said first and second groups of said conductors to said first and second inputs of said gates such that an RC delay associated with each conductor is distributed along a portion of the length of the conductor.

2. The device of claim 1 wherein said outputs of said gates are word lines having associated word line numbers, and said connecting means intersperses said word line numbers out of order to provide more even loading of said RC delays.

3. The device of claim 1 wherein said RC delay for a given one of said conductors is uniformly distributed along said given conductor.

4. The device of claim 1 wherein:

the array is a random access memory with a plurality of rows of memory cells, each row having a unique address; and said first and second groups of conductors carry predecoded logic levels associated with said address.

5. The device of claim 1 wherein said connecting means spreads out said RC delay for a given one of said conductors along substantially the entire length of said given conductor.

6. The device of claim 2 wherein said word line numbers are randomly interspersed.

7. The device of claim 2 wherein said word line numbers are mapped to said outputs of said gates according to a predetermined function.

8. The device of claim 4 wherein said addresses are encoded and, for a given one of said addresses, said predecoded logic levels result in only one of the conductors in said first group carries said active logic level, and only one of the conductors in said second group carries said active logic level, such that only one of said outputs of said gates presents said active logic level.

9. The device of claim 7 wherein said predetermined function is a modulo function.

10. The device of claim 7 wherein:

said word lines correspond to physical locations expressed by first and second series of bits; and said predetermined function encodes mapped locations of said word line numbers by assigning said first series of bits to said first group of conductors and by assigning said second series of bits, shifted by a value based on said first series of bits, to said second group of conductors.

11. The device of claim 8 wherein said connecting means spreads out said RC delay for a given one of said conductors uniformly along substantially the entire length of said given conductor.

12. A word line mapping circuit for a memory array having a plurality of rows of memory cells, comprising:

a plurality of word lines respectively connected to said rows;

means for encoding an address associated with a given row;

means for predecoding said address into a plurality of predecoded word lines; and means for presenting an active logic level to a given one of said word lines based on said plurality of predecoded word lines, said presenting means being connected to said predecoding means such that an RC load associated with a given one of said predecoded word lines is distributed along said given predecoded word line.

13. The word line mapping circuit of claim 12 wherein said word lines are interspersed, out of order, so as to provide more even loading of RC delays.

14. The word line mapping circuit of claim 12 wherein:

said word lines are tapped into said predecoded lines; and taps on said given predecoded word line are non-adjacent.

15. The word line mapping circuit of claim 12 wherein:

said predecoding means divides said predecoded word lines into first and second groups such that only one of said predecoded word lines in said first group carries a predecoded logic level, and only one of said predecoded word lines in said second group carries a predecoded logic level; and said presenting means comprises a plurality of AND gates each having a first input connected to one of said predecoded word lines in said first group, a second input connected to one of said predecoded word lines in said second group, and an output connected to one of said word lines, such that only one of said outputs of said gates presents said active logic level.

16. The word line mapping circuit of claim 12 wherein said RC load for said given predecoded word line is uniformly distributed along said given predecoded word line.

17. The word line mapping circuit of claim 12 wherein said presenting means is connected to said predecoding means such that said RC load for said given predecoded word line is distributed along substantially the entire length of said given predecoded word line.

18. The word line mapping circuit of claim 13 wherein said word lines are randomly interspersed.

19. The word line mapping circuit of claim 15 wherein said word lines are mapped to said outputs of said gates according to a predetermined function.

20. The word line mapping circuit of claim 19 wherein said predetermined function is a modulo function.

* * * * *